(12) United States Patent
Beer

(10) Patent No.: US 6,813,200 B2
(45) Date of Patent: Nov. 2, 2004

(54) CIRCUIT CONFIGURATION FOR READING OUT A PROGRAMMABLE LINK

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/627,841

(22) Filed: Jul. 25, 2003

(65) Prior Publication Data

US 2004/0156243 A1 Aug. 12, 2004

(30) Foreign Application Priority Data

Jul. 25, 2002 (DE) .......................................... 102 33 910

(51) Int. Cl.[7] .................................................. G11C 7/00
(52) U.S. Cl. .................................... 365/200; 365/225.7
(58) Field of Search ............................. 365/200, 225.7, 365/201, 154

(56) References Cited

U.S. PATENT DOCUMENTS 4,556,975 A * 12/1985 Smith et al. ................. 714/711
4,672,240 A * 6/1987 Smith et al. ................. 326/107
6,288,939 B1    9/2001 Kaiser et al.
2002/0083380 A1   6/2002 Kaiser et al.

FOREIGN PATENT DOCUMENTS

| DE | 197 08 965 C2 | 9/1998 |
| DE | 199 21 868 C2 | 11/2000 |
| DE | 100 63 626 A1 | 7/2002 |
| DE | 100 63 627 A1 | 7/2002 |

* cited by examiner

Primary Examiner—Vu A. Le
(74) Attorney, Agent, or Firm—Laurence A. Greenberg; Ralph E. Locher; Gregory L. Mayback

(57) ABSTRACT

A circuit configuration for reading out a programmable link enables programming the programmable link in addition to reading out the programmed value into a volatile memory cell. For this purpose, address lines that are present are coupled to the input of the volatile memory cell by additional switches. Given the presence of a hit signal at the output of a combination unit, the switches are driven by a control circuit in a manner dependent on a set signal. The present circuit is particularly suitable for dynamic semiconductor memories and for mass production.

6 Claims, 2 Drawing Sheets

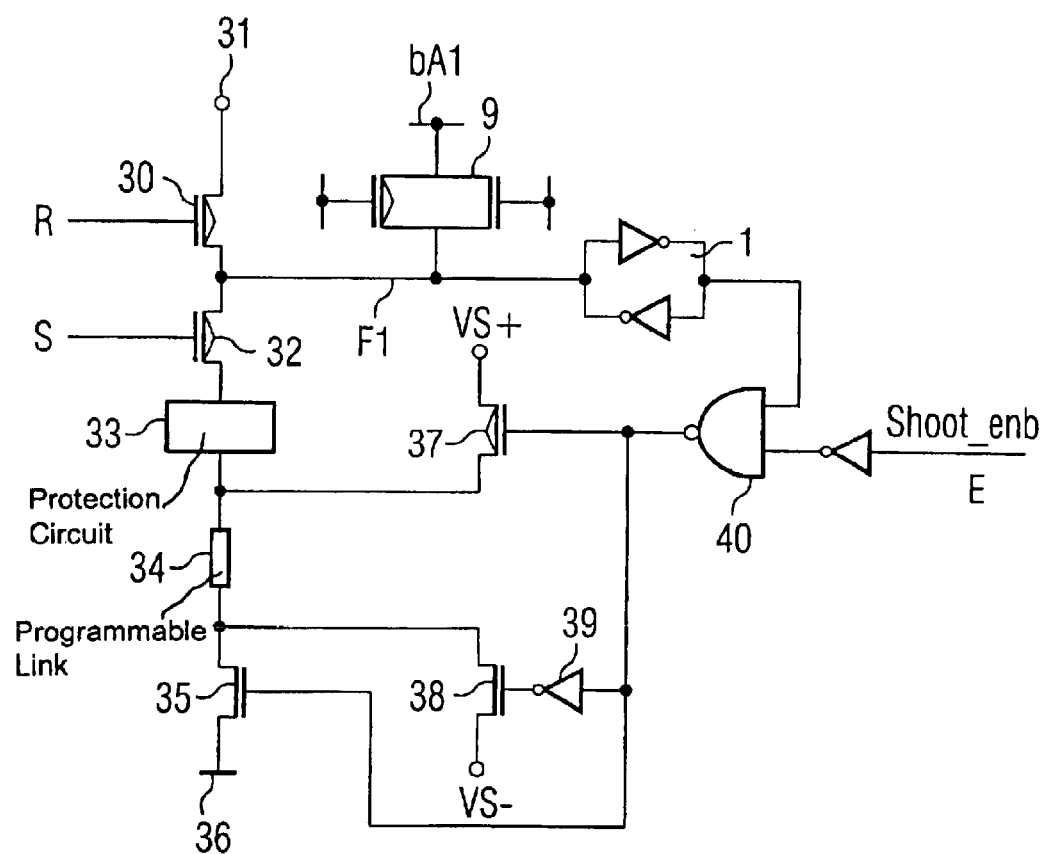

CIRCUIT CONFIGURATION FOR READING OUT A PROGRAMMABLE LINK

BACKGROUND OF THE INVENTION

Field of the Invention

The present invention relates to a circuit configuration for reading out a programmable link.

Large scale integrated semiconductor memory circuits normally have a multiplicity of memory cell arrays which in turn include a multiplicity of individual memory cells. During customary mass production of such integrated semiconductor memories it is no longer possible for all the memory cells to be produced without any defects. Therefore, a predetermined number of redundant memory cells are normally produced concomitantly on each semiconductor memory chip.

Memory cell arrays are normally structured in matrix form and include memory cells that are configured in columns and rows and can be selected, read from, and written to using so-called word lines and bit lines. The memory cells are configured at the crossover points between the word lines and the bit lines.

During the production of semiconductor memories, tests are usually carried out in order to identify the defective memory cells and to replace them by redundant memory cells. During these memory tests, it is normally the case that, in a memory cell array, entire word lines or entire bit lines or a plurality of word lines or bit lines are always used as the smallest redundant unit.

The assignment of which redundant element replaces which defective element in the memory cell array is defined by using programmable links, the so-called fuses. Fuses are non-volatile memory elements that can be programmed by feeding in an energy pulse. Each redundant element, that is to say each bit line, word line or interconnection of a plurality of word lines or bit lines has a bank of programmable links assigned to it—the so-called fuse bank. Each of these memory banks includes a so-called master fuse indicating that the associated redundant element is used as a repair element. The address of the element to be repaired in the memory cell array is coded with the remaining programmable links of the memory bank.

As soon as a memory cell array with the programmed address to be repaired is intended to be accessed in normal operation, the correspondingly assigned redundant element is accessed instead of a defective element. For this purpose, during each memory access, the desired memory address must be compared with all the programmed addresses of the redundant elements. Since access to the programmable links can only be carried out comparatively slowly, when the memory module is switched on or started up, all the programmable links are read out and the address data stored in the programmable links are stored in respectively assigned volatile memory cells. Such volatile memory cells are normally designed as a so-called latch or flip-flop. The actual address comparison which is effected during each memory access is then carried out with the copy of the address which is stored in the volatile memory cells.

The one-time programming of the programmable links during the abovementioned memory test during the production of the integrated memory module is normally effected such that, in a first step, the address data to be programmed are used to mark the electrical links to be programmed and, in a subsequent method step, the marked programmable links are programmed with an energy pulse, for example by applying a current surge or a voltage pulse.

It is known to perform the flagging of the links to be programmed by storing a corresponding datum in a volatile memory cell assigned to the respective programmable link. For this purpose, all the volatile memory cells can be coupled to a shift register, and the information about the programmable links to be programmed is shifted serially into the shift register. What is problematic, however, is that this shift register circuit has a comparatively large amount of components and a comparatively large chip area requirement. Moreover, comparatively elaborate wiring results on the chip. The comparatively high outlay is particularly problematic since a few hundred or even a few thousand redundant elements are provided on a semiconductor memory chip having a storage capacity of, for example, several hundred megabits.

SUMMARY OF THE INVENTION

It is accordingly an object of the invention to provide a circuit configuration for reading out a programmable link which overcomes the above-mentioned disadvantages of the prior art apparatus of this general type.

In particular, it is an object of the present invention to specify a circuit configuration for reading out a programmable link, which enables assigned programmable links to be marked during a memory test with a low outlay.

With the foregoing and other objects in view there is provided, in accordance with the invention, a circuit configuration for reading out a programmable link. The circuit configuration includes a volatile memory cell having an input coupled to the programmable link for reading out and buffer storing a programmed value. The volatile memory cell has an output. The circuit configuration also includes an address input for feeding an address value and a combination unit having a first input connected to the address input, a second input connected to the output of the volatile memory cell, and an output for providing a hit signal if the programmed value and the address value correspond. The circuit configuration includes a switch for coupling the address input to the input of the volatile memory cell for storing the address value in the volatile memory cell. The switch has a control input. The circuit configuration includes a device for programming the programmable link and a control circuit having an input coupled to the output of the combination unit. The control circuit has an output coupled to the control input of the switch and to the device for programming. The control circuit provides an activation signal.

In accordance with the present principle, the address values present at address inputs are used directly for flagging the programmable links to be programmed. In this case, as a result of corresponding address values being fed to the address input, a hit signal can be generated in a targeted manner at the output of the combination unit in order to select a specific memory bank with a multiplicity of links to be programmed. The hit signal drives the control circuit in such a way that, in a test operating mode, the address input is switched through to the volatile memory cell by a switch.

The switch advantageously enables the use of an address line in order to program the volatile memory cell, which is preferably embodied as a so-called latch.

As a result of combining the circuit configuration for reading out a programmable link with a switch between the address input and the volatile memory cell and the control circuit for driving the switch in a test operating mode, it is possible, in accordance with the present principle, to use the address values present at address inputs for programming the programmable link. The present principle makes it possible to dispense with a shift register for flagging the programmable links and can be realized with a significantly lower outlay on circuitry than a shift register.

The circuit inventive configuration can be used in dynamic semiconductor memories, so-called dynamic random access memories (DRAMS).

In accordance with the present principle, it is also possible for the address values of the address inputs not to be used directly for setting or resetting the assigned volatile memory cells, but rather for a hit signal to be generated in a targeted manner depending on an applied address value.

The volatile memory cell is preferably designed as a so-called latch.

The control circuit preferably includes a memory cell for storing the activation signal depending on a hit signal present.

The control circuit preferably has a further signal input, at which a set signal indicating a test operating mode is fed in. The activation signal is accordingly provided by the control circuit when a test operating mode is activated and when a hit signal indicates correspondence between programmed value and address value.

The address input is preferably embodied as an input pair with a first terminal for feeding in the address value itself (first address value) and a second terminal for feeding in the complementary address value (second address value). The address value is accordingly fed in, in inverted form at the second terminal. This advantageously enables a significantly simplified construction of the combination unit.

The present circuit configuration preferably includes a plurality of volatile memory cells, each of which is assigned to a respective programmable link. Each volatile memory cell is assigned an address input. The combination unit combines all the address inputs and all the volatile memory cells with one another and provides a hit signal at its output when the programmed values in the volatile memory cells all respectively correspond to the address values at the assigned address inputs. Furthermore, each volatile memory cell is preferably assigned a switch that couples the input of the volatile memory cell to the address input and is in each case connected to the control circuit by its control input.

The programmable link is preferably designed as a so-called E-fuse or E-antifuse and is permanently altered in terms of its conductivity state by applying an energy pulse, for example a current pulse or an overvoltage. For this purpose, preferably at least one transistor is provided, which couples the programmable link to a supply potential terminal. An overvoltage, the so-called shooting voltage, is preferably present at the supply potential terminal. The control input of the transistor is preferably connected to the output of the control unit.

A device for storing an intrinsic address value that is respectively assigned to a programmable link is preferably provided in the combination unit. It is thus possible, by applying a suitable address value to the address input or inputs, to address the intrinsic address of the programmed link and to generate a hit signal when the address value corresponds to the intrinsic address. In this case, the intrinsic address is preferably read out during an activated test operating mode.

Other features which are considered as characteristic for the invention are set forth in the appended claims.

Although the invention is illustrated and described herein as embodied in a circuit configuration for reading out a programmable link, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit diagram of an exemplary embodiment of a programmable link for connection to the circuit configuration shown in FIG. 1.

DESCRIPTION OF THE PREFERRED EMBODIMENTS

Figure 1:
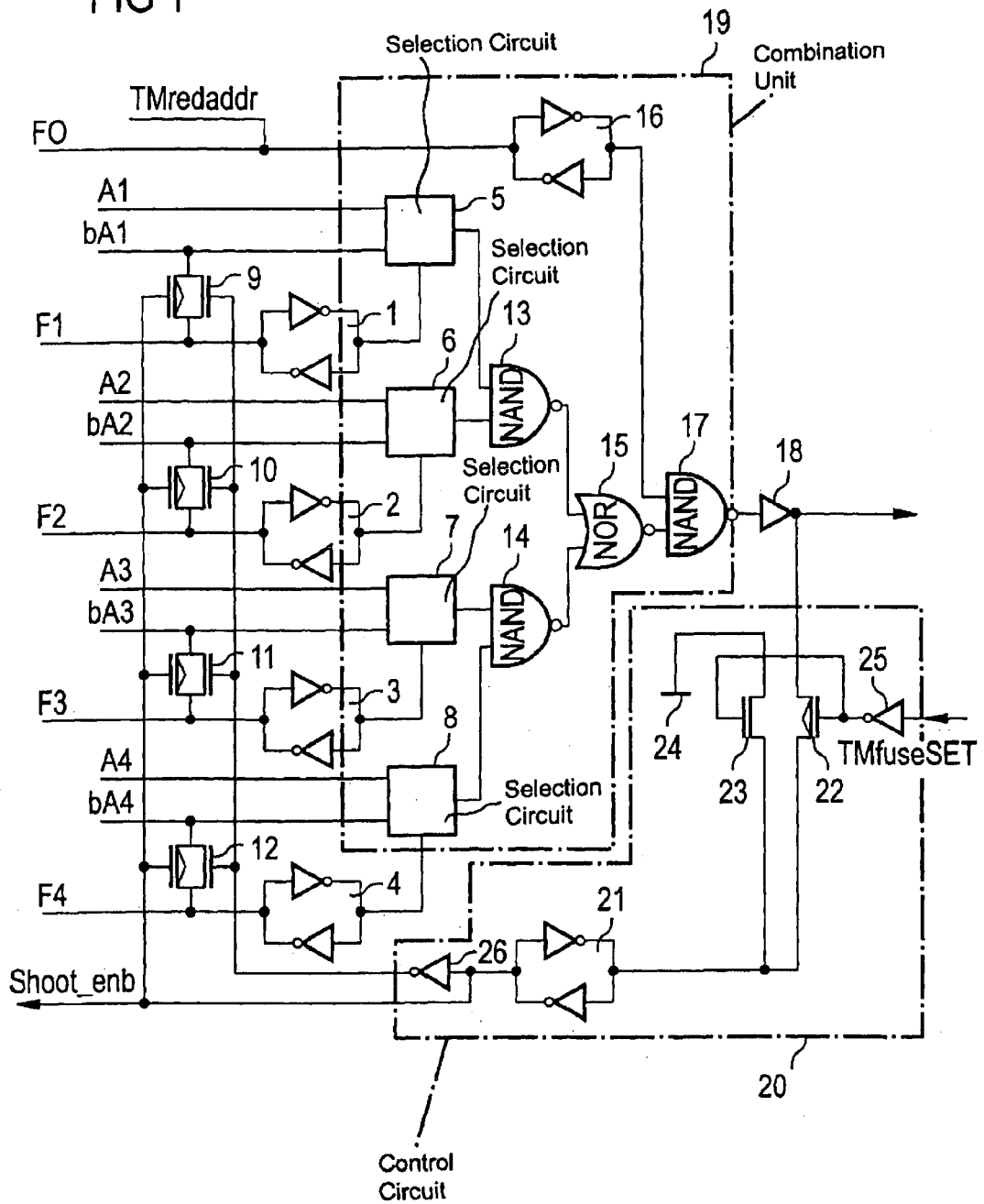
FIG. 1 is a circuit diagram of a first exemplary embodiment of a circuit configuration for reading out a programmable link.

Referring now to the figures of the drawing in detail and first, particularly, to FIG. 1 thereof, there is shown a circuit configuration for reading out and flagging a programmable link in accordance with the present principle. By way of example, the circuit configuration is designed for reading out four programmable links configured in a fuse bank. Accordingly, with the present circuit configuration, it is possible to store addresses with an address width of four bits for coding an address of a memory element to be replaced in a memory cell array. In this case, the address to be stored may be either the address of a word line to be replaced, the address of a bit line to be replaced or the address of a block of a plurality of word lines and/or bit lines.

The circuit configuration for reading out a programmable link, which is shown in FIG. 1, includes four volatile memory cells 1, 2, 3, 4 that are each assigned a programmable link. The input terminals of the volatile memory cells 1 to 4 are designated by F1 to F4 and are designed in each case for coupling to a data output of an assigned programmable link. An assigned selection circuit 5 to 8 is respectively connected to outputs of the volatile memory cells 1 to 4. Furthermore, the selection circuits 5 to 8 each have an address input, each address input comprising a first terminal A1, A2, A3, A4 and a second terminal bA1, bA2, bA3, bA4. A respective bit of a four-bit address word is fed unchanged to the first terminals of the address inputs A1 to A4, while the respective complementary address value is fed to the second terminals bA1 to bA4 of the selection circuits 5 to 8.

The inputs F1 to F4 of the volatile memory cells 1 to 4 are coupled to the respectively assigned second terminals of the address input bA1 to bA4 via a respective transmission gate 9, 10, 11, 12. The transmission gates 9 to 12, embodied as switches, each include a p-channel field-effect transistor with an n-channel field-effect transistor connected in parallel. The outputs of the selection circuits 5 to 8 are in each case combined in pairs in a NAND logic gate 13, 14, whose outputs are connected to the inputs of a NOR gate 15.

The combination unit for combining address values and programmed values 19 includes the selection circuits 5, 6, 7, 8, the logic gates 13, 14, 15 and, in addition, a further volatile memory cell 16, whose output is connected to a first input of a NAND gate 17. The second input of the NAND gate 17 is connected to the output of the NOR element 15. At the output of the NAND gate 17, conditioned by an inverter 18, a hit signal is output in a manner dependent on the address values present and the read-out programming values of the programmable links. The volatile memory cell 16, like the rest of the volatile memory cells 1 to 4, is formed by back-to-back connections of two inverters. Connected to the input F0 of the volatile memory cell 16 is a programmable link, the so-called master fuse, which indicates whether the present circuit configuration has been used and activated during production for repairing a defective memory cell or a plurality of defective memory cells. A corresponding signal is identified by TMredaddr for Test Mode Redundancy Address and can likewise be fed in at the input of the volatile memory cell 16.

A control circuit 20 is provided for driving the switches 9 to 12 at the control inputs of the complementary transistor pairs. The control circuit 20 couples the output of the combination unit 19 to the control inputs of the transmission gates 9 to 12. The control circuit 20 includes a volatile memory cell 21. The control circuit 20 switches a hit signal, provided by the combination unit 19, through to the volatile memory cell 21, when an activation signal indicates that a programming of the programmable links is desired. This activation signal is designated by TMfuseSET.

For this purpose, the control circuit 20 includes a p-channel field-effect transistor 22, which couples the output of the combination unit 19 to the volatile memory cell 21. Furthermore, an n-channel field-effect transistor 23 is provided, which connects the input of the volatile memory cell 21 to a reference-ground potential terminal 24. The control inputs of the transistors 22, 23 are connected to one another and are coupled via an inverter 25 to the input terminal for feeding in the set signal TMfuseSET. In order to form a so-called latch, the volatile memory cell 21 includes two inverters connected back-to-back. The output of the volatile memory cell 21 is connected via an inverter 26 to the control inputs of the NMOS transistors in the transmission gates 9 to 12, and in unchanged fashion to the PMOS transistors of the transmission gates 9 to 12. In addition, an activating signal shoot_enb is provided at the output of the volatile memory cell 21, which signal is suitable for controlling a device for programming the programmable links.

The read-out programmable links that have already been programmed will be explained first of all. During a switch-on process of the memory element in which the read-out circuit in accordance with FIG. 1 is configured, the programmed values are read out from the programmable links and written to the volatile memory cells 1 to 4 via the inputs F1 to F4. In the present example, in the case of programmable links to which energy pulses have not been applied, a logic 1 will be present at the input of the volatile memory cells 1 to 4 and a zero will accordingly be present at their output. By using the selection circuits 5 to 8 respectively assigned to the volatile memory cell 1 to 4, an applied address value at the address input A1 to A4 is compared with the value programmed in the volatile memory cell 1 to 4. If the values correspond in all the selection circuits 5 to 8 and if the so-called master fuse is also set at the input F0 and buffer-stored in the volatile memory 16, then a hit signal is generated. As a result of this, the associated redundant memory element is activated and the activation of the original, defective memory element is suppressed. This is not illustrated, however, in the circuit of FIG. 1.

The reprogramming of a programmable link proceeding from its original state of conduction to a different state of conduction has the effect that the actual address A1, A2, A3 or A4 and its complement, e.g. bA1, bA2, bA3 or bA4, are interchanged at the input of the selection circuits 5 to 8, which operate as comparators. In the present example, the complement of the address is always fed in in the unprogrammed state. Thus, if only the master fuse were reprogrammed, then the assigned redundant memory element would replace the defective memory element with the address (A4, A3, A2, A1=0000). By the choice of whether the address itself or its complement is fed into the comparing selection circuit 5 to 8, the redundant element itself can be coded. This is necessary in order to be able to address the redundant elements for test purposes even before the repair. For this purpose, all the master fuses are set to "programmed" in a test operating mode TMredaddr.

However, the present invention enables not only a read-out of programmed values from programmable links, but also a flagging of those programmable links which are intended to be programmed during the production of the memory for the purpose of replacing defective memory cells. For this purpose, the transmission gates 9 to 12 are provided, inter alia, which connect the input of each fuse latch 1 to 4 to the corresponding address input.

In the case where the set signal TMfuseSET has been set, a hit signal provided by the combination unit 19 is stored in the volatile memory cell 21 in the control circuit 20. In this case, the volatile memory cell 21 activates the switch connections 9 to 12 between the address lines bA1 to bA4 and the assigned volatile memory cells 1 to 4. The soft set of the volatile memory cells 1 to 4 is then carried out as follows: first, as already explained above, the test operation TMredaddr is activated and a corresponding signal is stored in the volatile memory cell 16. By way of the corresponding permanently stored or intrinsic address of the redundancy element, the address 0000 in the present example, a hit signal is constrained at the output of the combination unit 19. This signal is stored in the volatile memory cell 21 by setting the set signal TMfuseSET. An address thereupon applied to the address inputs A1 to A4 or bA1 to bA4 is then written directly to the fuse latches 1 to 4.

However, the present circuit can be used not only for the so-called soft set of programmable links. It is additionally possible to utilize the information stored in the volatile memory cells 1 to 4 to indicate whether or not the assigned programmable link connected to the input F1 to F4 is to be reprogrammed. The reprogramming of fuses is also referred to as shooting. For this purpose, as indicated in FIG. 1, the hit signal value stored in the volatile memory cell 21 can also be used as an activation signal for the programming of one or more programmable links. If, depending on the embodiment of the programmable link and the drive circuit thereof, for example, only one electrically programmable link can be programmed at the same time per cycle, then it is possible, for example, first to program the so-called master fuse, while the fuse latches 1 to 4 are switched to nonprogramming. The test operation TMredaddr is then deactivated and the programmable links are subsequently programmed successively at the inputs F1 to F4.

As a result of the insertion of the switches 9 to 12 and the control unit 20 which drives the latter in a manner dependent on a hit signal and a set signal, the present circuit configuration for reading out a programmable link is advantageously developed such that the address lines A1 to A4 can be used for flagging the programmable links to be programmed. Consequently, with a particularly low outlay on circuitry and without the need for shift registers, it is possible to mark and program those programmable links which serve for storing an address indicating which defective element in a semiconductor memory is to be replaced by the present redundancy element.

FIG. 2 shows, by way of example for the first volatile memory cell 1, the programmable link that can be coupled to the terminal F1 of FIG. 1. FIG. 2 shows the volatile memory cell 1 and also the assigned switch 9 connected to the input of the volatile memory cell, which correspond to the components of FIG. 1 that are provided with the same reference symbols. Switch 9 couples the input of the volatile memory cell 1 to the second terminal of the address input which is assigned to the volatile memory cell 1. The connection node F1 of the volatile memory cell 1 and switch 9 has connected to it first of all a reset transistor 30, on the load side, with respect to a supply potential terminal 31, and a series circuit comprising a set transistor 32, a protection circuit 33 the programmable link 34 and an activation transistor 35 with respect to reference-ground potential terminal 36. The control inputs of the reset transistor, embodied as a PMOS transistor 30, and the set transistor 32, designed as an NMOS field-effect transistor, are designated by R, S. Furthermore, two blowing transistors 37, 38 are provided. A respective load terminal of each the blowing transistors 37, 38 is connected to a positive and negative energy pulse supply potential VS+, VS−, respectively. The free load terminal of each respective blowing transistor 37, 38 is connected to a respective terminal of the programmable link 34. The control inputs of the transistors 35 and 37 are directly connected. The control input of the transistor 38 is connected via an inverter 39, to the output of a NAND element 40. A first input NAND element 40 is connected to the output of the volatile memory 1. A second input of the NAND element 40 is connected, via an inverter, to the output terminal E (to receive signal Shoot_enb) of the volatile memory 21 of the control circuit 20.

The programmable link 34 is read out by way of the control inputs R, S when the memory in which the present circuit configuration is provided is switched on. This value is written to the volatile memory cell 1, as explained. For reprogramming the programmable link 34, by contrast, that is to say for the purpose of altering its state of conduction, depending on the activation signal present at the terminal E, the high voltage between the potential VS+ and VS− is applied across the programmable link 34 and the state of conduction thereof is thus permanently altered.

I claim:

1. A circuit configuration for reading out a programmable link, comprising:
    a volatile memory cell having an input coupled to the programmable link for reading out and buffer storing a programmed value, said volatile memory cell having an output;
    an address input for feeding an address value;
    a combination unit having a first input connected to said address input, a second input connected to said output of said volatile memory cell, and an output for providing a hit signal if the programmed value and the address value correspond;
    a switch for coupling said address input to said input of said volatile memory cell for storing the address value in said volatile memory cell, said switch having a control input;
    a device for programming the programmable link; and
    a control circuit having an input coupled to said output of said combination unit;
    said control circuit having an output coupled to said control input of said switch and to said device for programming; and
    said control circuit providing an activation signal.

2. The circuit configuration according to claim 1, wherein said control circuit includes a memory cell for storing the activation signal.

3. The circuit configuration according to claim 1, wherein:
    said control circuit has a further signal input that is fed with a set signal in a test operating mode; and
    the activation signal is dependent on the set signal.

4. The circuit configuration according to claim 1, wherein said address input is embodied as an input pair including a first terminal for feeding in a first address value and a second terminal for feeding in a second address value that is complementary to the first address value.

5. The circuit configuration according to claim 1, further comprising:
    a further volatile memory cell having an input coupled to a further programmable link for reading out and buffer storing a further programmed value, said further volatile memory cell having an output;
    a further address input for feeding in a further address value, said combination unit having a further first input connected to said further address input and a further second input connected to said output of said further volatile memory cell, said combination unit having an output designed for providing a hit signal if the programmed value and the address value correspond and if the further programmed value and the further address value correspond; and
    a further switch for coupling said further address input to said input of said further volatile memory cell for storing the further address value in said further volatile memory cell.

6. The circuit configuration according to claim 1, wherein:
    said device for programming the programmable link includes at least one transistor designed for applying an energy pulse to the programmable link;
    said transistor couples the programmable link to a supply potential terminal and said transistor has a control input coupled to said output of said control unit.

* * * * *